United States Patent
Sohn et al.

(10) Patent No.: US 10,460,436 B2
(45) Date of Patent: Oct. 29, 2019

(54) INSPECTION METHOD, INSPECTION SYSTEM, AND METHOD OF FABRICATING SEMICONDUCTOR PACKAGE USING THE SAME

(71) Applicant: Samsung Electronics Co., Ltd., Suwon-si, Gyeonggi-do (KR)

(72) Inventors: Younghoon Sohn, Incheon (KR); Ilsoo Kim, Hwaseong-si (KR); Yusin Yang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 229 days.

(21) Appl. No.: 15/691,958

(22) Filed: Aug. 31, 2017

(65) Prior Publication Data
US 2018/0101940 A1   Apr. 12, 2018

(30) Foreign Application Priority Data
Oct. 11, 2016 (KR) .......................... 10-2016-0131501

(51) Int. Cl.
*G06T 7/00* (2017.01)
*H01L 21/66* (2006.01)
(Continued)

(52) U.S. Cl.
CPC ............. *G06T 7/001* (2013.01); *H01L 22/12* (2013.01); *H01L 22/20* (2013.01); *H01L 23/498* (2013.01);
(Continued)

(58) Field of Classification Search
CPC ....... H01L 23/498; H01L 22/20; H01L 22/12; H01L 24/97; H01L 2924/15311; G06T 7/0002–001; G06T 2207/30148
See application file for complete search history.

(56) References Cited

U.S. PATENT DOCUMENTS

| | | |
|---|---|---|
| 5,955,661 A | 9/1999 | Samsavar et al. |
| 6,067,165 A | 5/2000 | Matsumiya et al. |
| (Continued) | | |

FOREIGN PATENT DOCUMENTS

| | | | |
|---|---|---|---|
| JP | 2010-212359 | * | 9/2010 |
| JP | 5104438 B2 | | 12/2012 |
| (Continued) | | | |

OTHER PUBLICATIONS

Machine translation for JP 2010-212359, Soeda et al. (Year: 2010).*

*Primary Examiner* — Qian Yang
(74) *Attorney, Agent, or Firm* — Harness, Dickey & Pierce, P.L.C.

(57) ABSTRACT

Disclosed are an inspection method, an inspection system, and a method of fabricating a semiconductor package using the same. The inspection method comprises obtaining a reference value by measuring a surface profile of a reference pattern, scanning reference images of the reference pattern by using a plurality of optical inspection conditions, obtaining estimation values of the reference pattern that are measured from the reference images, selecting an desired optical inspection condition among the plurality of optical inspection conditions by comparing the reference value with the estimation values, scanning a target image of a target pattern by using the desired optical inspection condition, and obtaining an error value by quantitatively comparing the target image with a design image of the target pattern.

20 Claims, 14 Drawing Sheets

(51) Int. Cl.
 *H01L 23/498* (2006.01)
 *H01L 23/00* (2006.01)
(52) U.S. Cl.
 CPC .... *G06T 2207/30148* (2013.01); *H01L 24/97* (2013.01); *H01L 2924/15311* (2013.01)

(56) References Cited

U.S. PATENT DOCUMENTS

| | | | |
|---|---|---|---|
| 7,518,110 B2* | 4/2009 | Sutani | H01J 37/265 |
| | | | 250/307 |
| 8,513,625 B2 | 8/2013 | Dana et al. | |
| 8,959,980 B2 | 2/2015 | Vodnick et al. | |
| 9,250,071 B2 | 2/2016 | Lee et al. | |
| 9,965,844 B1* | 5/2018 | Fang | G06T 7/0004 |
| 2002/0158197 A1 | 10/2002 | Dana et al. | |
| 2006/0159330 A1* | 7/2006 | Sakai | G06T 7/001 |
| | | | 382/141 |
| 2013/0294677 A1* | 11/2013 | Urano | G01N 21/956 |
| | | | 382/141 |
| 2014/0212023 A1* | 7/2014 | Fujii | G06T 7/0004 |
| | | | 382/149 |
| 2016/0019689 A1* | 1/2016 | Inoue | G06T 7/001 |
| | | | 382/149 |
| 2016/0358745 A1* | 12/2016 | Katou | G06T 7/0004 |

FOREIGN PATENT DOCUMENTS

| | | |
|---|---|---|
| KR | 10-0883967 B1 | 2/2009 |
| KR | 10-2015-0131495 | 11/2015 |

* cited by examiner

INSPECTION METHOD, INSPECTION SYSTEM, AND METHOD OF FABRICATING SEMICONDUCTOR PACKAGE USING THE SAME

CROSS-REFERENCE TO RELATED APPLICATIONS

This U.S. nonprovisional patent application claims priority under 35 U.S.C § 119 of Korean Patent Application No. 10-2016-0131501 filed on Oct. 11, 2016 entire contents of which are hereby incorporated by reference.

BACKGROUND

The inventive concepts relate to an inspection method, an inspection system, and a method of fabricating a fan-out package using the same.

Sizes of semiconductor chips becomes smaller with high integration of the semiconductor chip. However, the intervals between bumps on a semiconductor chip are fixed by an international standard of an international electronics standardization organization, the Joint Electronic Device Engineering Council (JEDEC). Bonding a desired number of the bumps to the semiconductor chip may thus be difficult. In addition, as the size of the semiconductor chip becomes reduced, handling and testing the semiconductor chips become more difficult. Additionally, problems of acquiring diversified mount boards in accordance with the size of the semiconductor chip occur. In order to mitigate or improve on the problems above, a fan-out package has been developed.

A fan-out packaging process may include forming insulation layers and routing lines on a substrate on which a semiconductor chip is mounted. The routing lines may include variously shaped patterns, and a highly accurate inspection method is required to minimize or reduce defects occurred on the various shaped patterns.

SUMMARY

Embodiments of the inventive concepts provide a quantitative inspection method and an inspection system having high accuracy.

Embodiments of the inventive concepts provide a method of fabricating a semiconductor package capable of minimizing or reducing defect occurrence.

According to example embodiments of the inventive concepts an inspection method may comprise: obtaining a reference value by measuring a surface profile of a reference pattern; scanning reference images of the reference pattern by using a plurality of optical inspection conditions; obtaining estimation values of the reference pattern that are measured from the reference images; selecting an optimum, or desired, optical inspection condition among the plurality of optical inspection conditions by comparing the reference value with the estimation values; scanning a target image of a target pattern by using the optimum, or desired, optical inspection condition; obtaining an error value by quantitatively comparing the target image with a design image of the target pattern; and fabricating a semiconductor package according to a process condition determined by the error value.

According to example embodiments of the inventive concepts an inspection system may comprise: a stage for loading a wafer; a profilometer that measures a surface profile of a reference pattern formed on the wafer; an optical inspection unit that uses a plurality of optical inspection conditions to scan reference images of the reference pattern; and a data processor that obtains a reference value of the reference pattern from the surface profile, obtains estimation values of the reference pattern from the reference images, and selects an optimum, or desired, optical inspection condition among the plurality of optical inspection conditions by comparing the reference value with the estimation values.

According to example embodiments of the inventive concepts a method of fabricating a semiconductor package may comprise: preparing a sample wafer including a plurality of patterns formed using a pre-selected design image; performing a quantitative inspection on the plurality of patterns; and forming routing lines on a semiconductor package substrate by using a process condition of a desired process, the process condition being selected using a result of the quantitative inspection. The design image may be a design image of a weak routing pattern, among the routing lines, having a high probability of occurrence of defects. The step of performing the quantitative inspection on the plurality of patterns may comprise: obtaining a reference value by measuring a surface profile of a reference pattern selected from the plurality of patterns; scanning reference images of the reference pattern by using a plurality of optical inspection conditions; obtaining estimation values of the reference pattern that are measured from the reference images; selecting an optimum, or desired, optical inspection condition among the plurality of optical inspection conditions by comparing the reference value with the estimation values; scanning a target image of a target pattern selected from the plurality of patterns by using the optimum, or desired, optical inspection condition; obtaining an error value by numerically comparing the design image with the target image. The forming the routing lines may include forming the routing lines on the semiconductor package substrate to fabricate a semiconductor package using the process condition determined by the error value.

According to example embodiments of the inventive concepts, an inspection method may comprise: obtaining a reference value by measuring a line width of a reference pattern; scanning reference images of the reference pattern by using a plurality of inspection conditions; obtaining estimation values of the reference pattern measured from the reference images; and selecting a desired inspection condition among the plurality of inspection conditions by comparing the reference value with the estimation values. The method may further comprise scanning a target image of a target pattern by using the desired inspection condition; obtaining an error value by comparing the target image with a design image of the target pattern; and fabricating an electronic system according to a process condition determined by the error value.

DETAILED DESCRIPTION OF EMBODIMENTS

It will be hereinafter described example embodiments of the inventive concepts in conjunction with the accompanying drawings.

Figure 1:
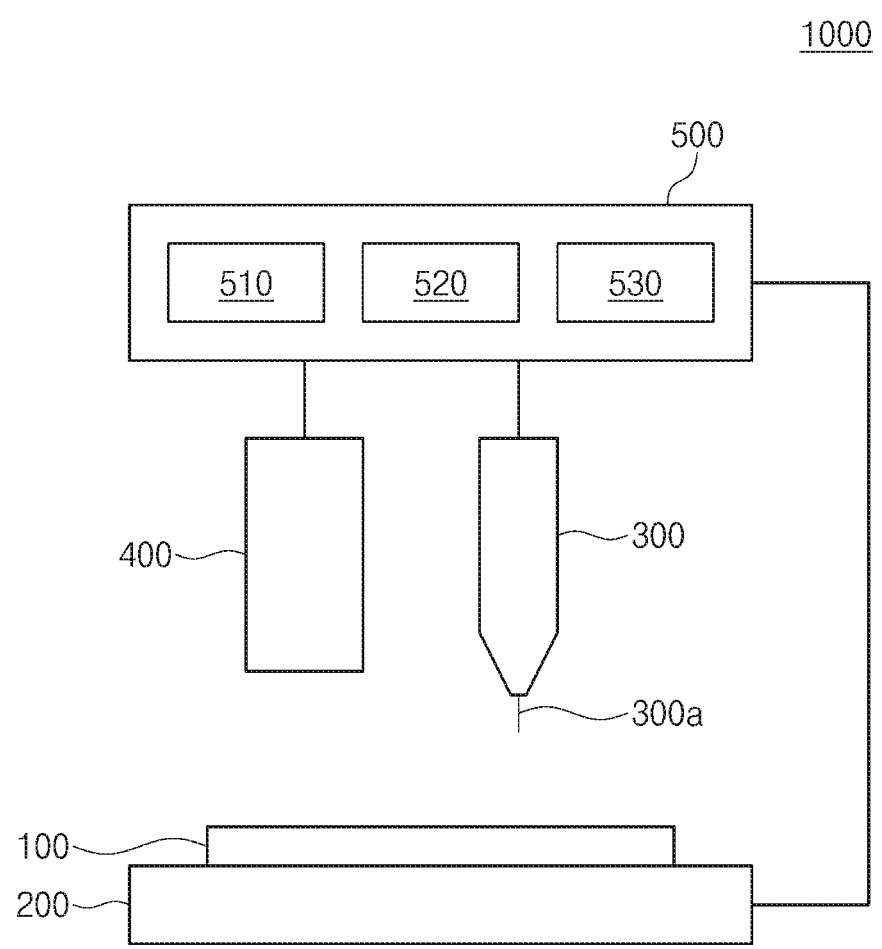
FIG. 1 is a simplified schematic diagram illustrating an inspection system according to example embodiments of the inventive concepts.
Figure 2:
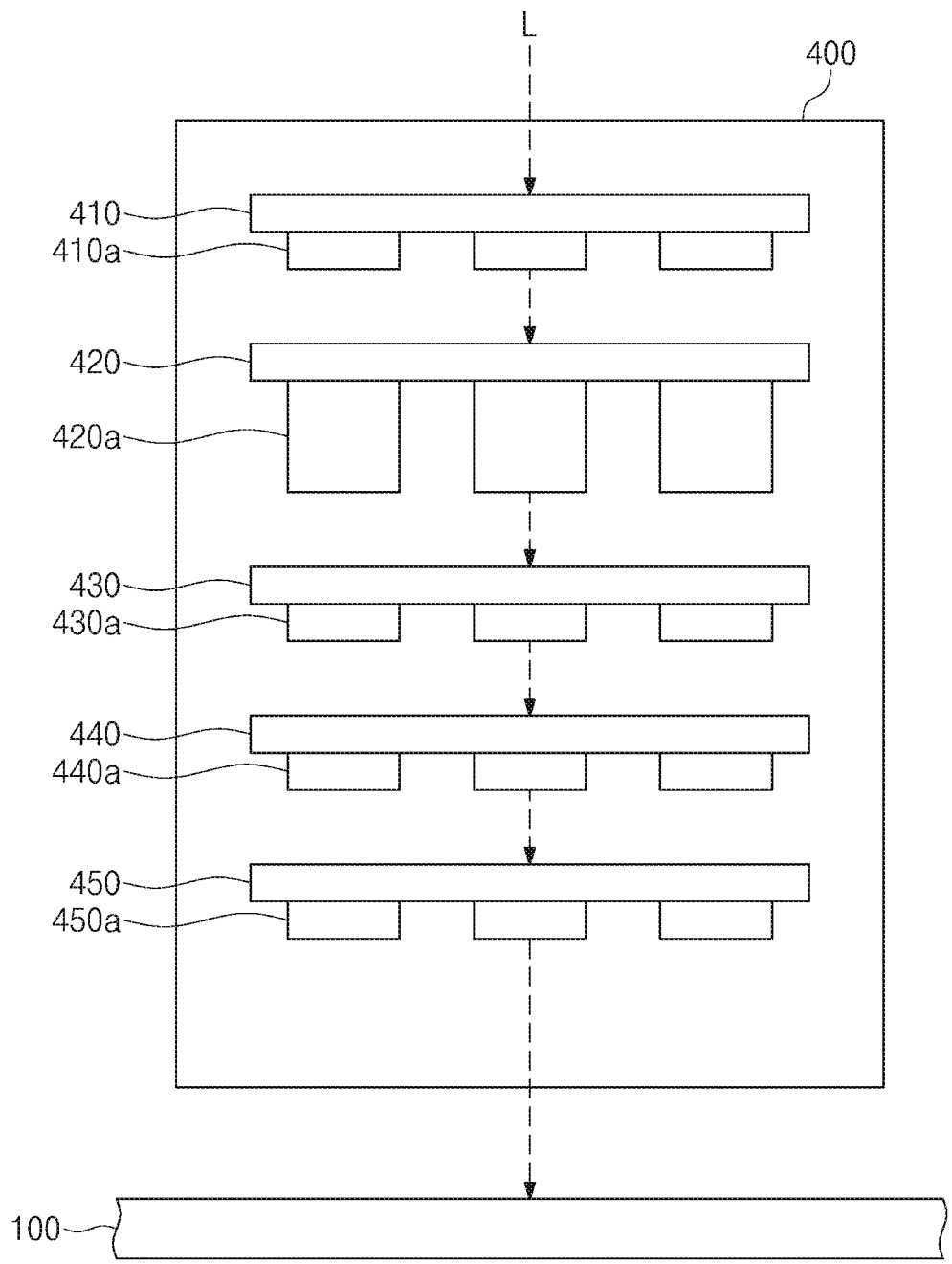
FIG. 2 is a conceptual diagram for explaining an optical inspection unit of FIG. 1.

FIG. 1 is a simplified schematic diagram illustrating an inspection system according to example embodiments of the inventive concepts. FIG. 2 is a conceptual diagram for explaining an optical inspection unit of FIG. 2, and FIG. 3 is an exploded perspective view illustrating a portion of the optical inspection unit of FIG. 2.

Referring to FIG. 1, an inspection system 1000 may include a stage 200 on which a wafer 100 is loaded, a profilometer 300 that measures a surface profile of a pattern formed on the wafer 100, an optical inspection unit 400 that scans an optical image of the pattern formed on the wafer 100, and a computer 500 that stores and processes data obtained from the profilometer 300 and the optical inspection unit 400. The profilometer 300 may be a contact or pseudo-contact profilometer. The profilometer 300 may include a probe 300a equipped with its end, and the probe 300a may be in physical contact with a surface of the pattern formed on the wafer 100. For example, the profilometer 300 may be a stylus profilometer that measures the surface profile of the pattern by physically contacting the surface of the pattern formed on the wafer 100.

The inventive concepts are not limited thereto, and other non-contact metrology methods may be used to measure the surface profile. For example, interferometry methods, confocal microscopy, electron microscopy, capacitive measurements, and/or other methods may be used to measure the surface profile.

Figure 3:
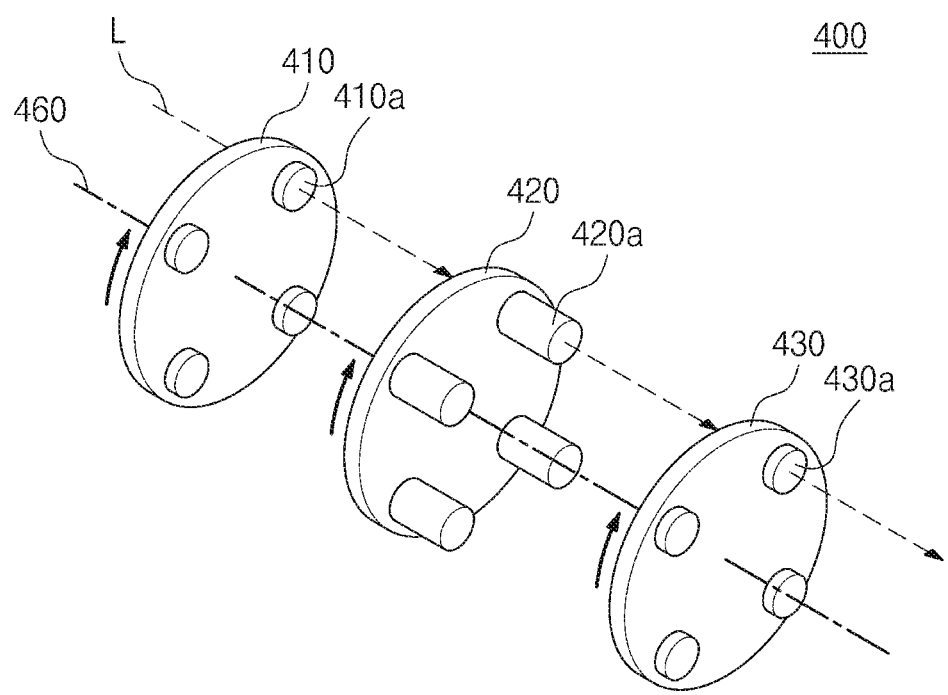
FIG. 3 is an exploded perspective view illustrating a portion of the optical inspection unit of FIG. 2.

Referring to FIGS. 1 to 3, the optical inspection unit 400 may include a first filter unit 410 for adjusting an amount of light L irradiated onto the wafer 100, a lens unit 420 for adjusting magnification of the optical inspection unit 400, an iris diaphragm unit 430 for adjusting an angular range of the light L irradiated onto the wafer 100, a polarizer unit 440 for polarizing the light L, and a second filer unit 450 for adjusting a wavelength of the light L. The first filter unit 410 may include a plurality of first filters 410a allowing the light L to irradiate onto the wafer with different amounts. The light L may be controlled to pass through one of the plurality of first filters 410a, and thus changing an amount of the light L irradiated onto the wafer 100 may be possible. The lens unit 420 may include a plurality of lenses 420a allowing the optical inspection unit 400 to have different magnifications. The light L may be controlled to pass through one of the plurality of lenses 420a, and thus the magnification of the optical inspection unit 400 may be changed. The iris diaphragm unit 430 may include a plurality of iris diaphragms 430a allowing the light L to irradiate onto the wafer with different angular ranges. The light L may be controlled to pass through one of the plurality of iris diaphragms 430a, and changing an angular range of the light L irradiated onto the wafer 100 may thus be possible. The polarizer unit 440 may include changing a plurality of polarizers 440a allowing the light L to irradiate onto the wafer with different polarization states may be possible. The light L may be controlled to pass through at least one of the plurality of polarizers 440a, and thus a polarization state of the light L may be changed. The second filter unit 450 may include a plurality of second filters 450a allowing the light L to irradiate onto the wafer with different wavelengths. The light L may be controlled to pass through at least one of the plurality of second filters 450a, and thus a wavelength of the light L may be changed. Each of, or at least one of the first filter unit 410, the lens unit 420, the iris diaphragm unit 430, the polarizer unit 440, and the second filter unit 450 may have a turret structure that rotates around its central axis 460 as a rotational axis. Each of, or at least one of the first filter unit 410, the lens unit 420, the iris diaphragm unit 430, the polarizer unit 440, and the second filter unit 450 may rotate to allow the light L to pass through at least one of the plurality of first filters 410a, one of the plurality of lenses 420a, one of the plurality of iris diaphragms 430a, one of the plurality of polarizers 440a, and one of the plurality of second filters 450a. Changing the amount of the light L, the angular range of the light L irradiated onto the wafer 100, the polarization state of the light L, the wavelength of the light L, and the magnification of the optical inspection unit 400 may thus be possible. That is, an optical inspection condition of the optical inspection unit 400 may be changed due to the rotation of each of, or at least one of the first filter unit 410, the lens unit 420, the iris diaphragm unit 430, the polarizer unit 440, and the second filter unit 450. Although not shown in figures, the optical inspection unit 400 may further include additional components required for operating the optical inspection in a determined, or alternatively desired, condition.

The inventive concepts are not limited thereto. For example, a non-optical scanning electron microscope or a scatterometer may be used in lieu of the optical inspection unit.

Referring back to FIG. 1, the computer 500 may include a data processor 510 for processing various data and a library 520 for storing various data. The library 520 may include a hard disk and/or a nonvolatile semiconductor memory device (e.g., a flash memory device, a phase change memory device, and/or a magnetic memory device). Described below include details of the data processor 510 and the library 520. In order to measure an image of a pattern formed on the wafer 100 using different optical inspection conditions, the computer 500 may further include a controller 530 for controlling each of, or at least one of the first filter unit 410, the lens unit 420, the iris diaphragm unit 430, the polarizer unit 440, and the second filter unit 450 in the optical inspection unit 400. The controller 530 may control the stage 200 to change a horizontal position of the wafer 100. Although not shown in the figures, the computer 500 may include an input/output and an interface. The input/output may include a keyboard, a keypad, and/or a display device. The computer 500 may receive, through the interface, data transmitted from the profilometer 300 and the optical inspection unit 400. The interface may include, e.g., a wired component, a wireless component, a universal serial bus (USB) port, and so on. A data bus may be provided to connect the data processor 510, the library 520, the controller 530, the input/output, and the interface to each other.

Hereinafter are described an inspection method using the inspection system 1000.

Figure 4:
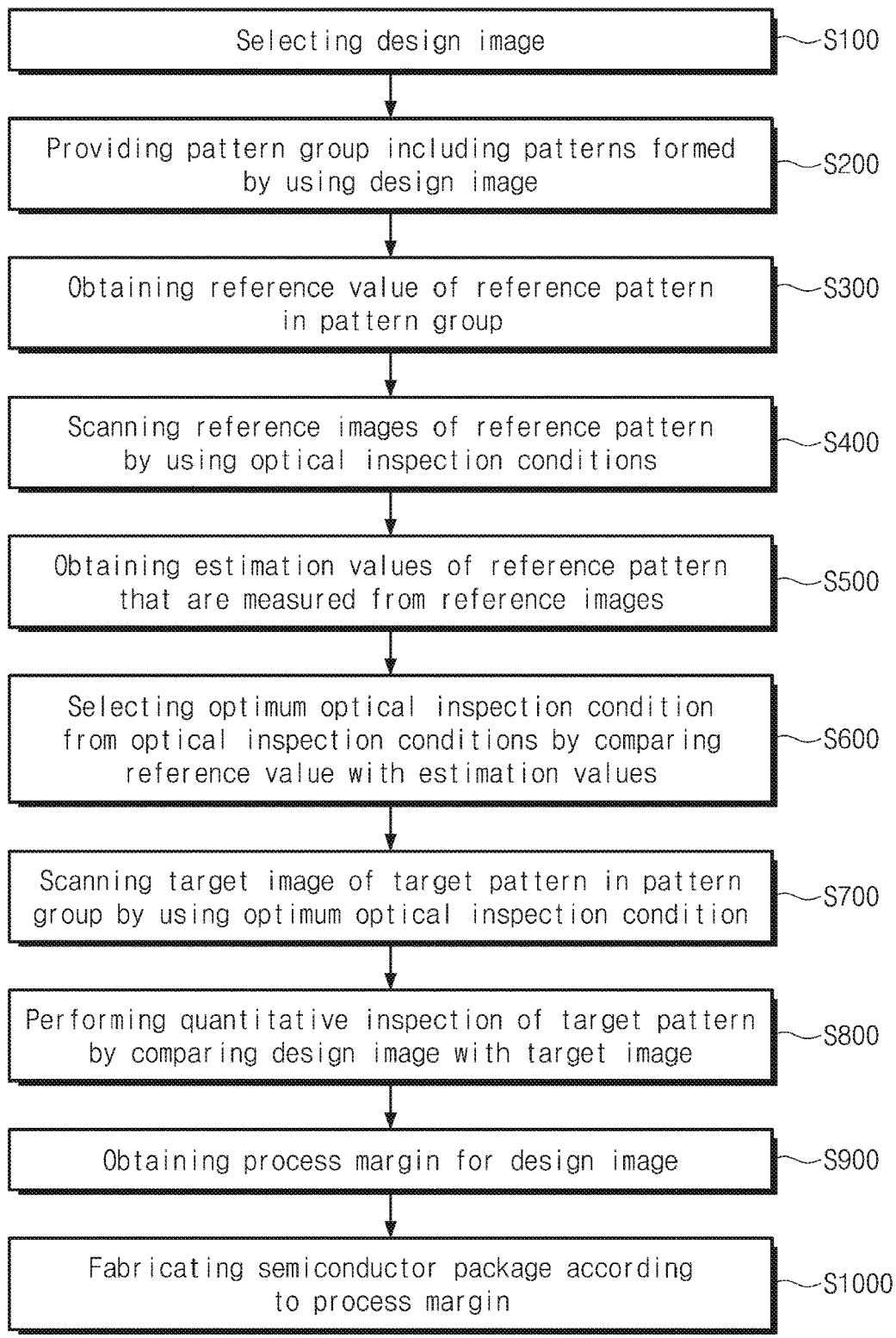
FIG. 4 is a flow chart for explaining an inspection method according to example embodiments of the inventive concepts.

FIG. 4 is a flow chart for explaining an inspection method according to example embodiments of the inventive concepts. FIGS. 5 to 11 are conceptual diagrams for explaining the inspection method of FIG. 4.

Figure 5:
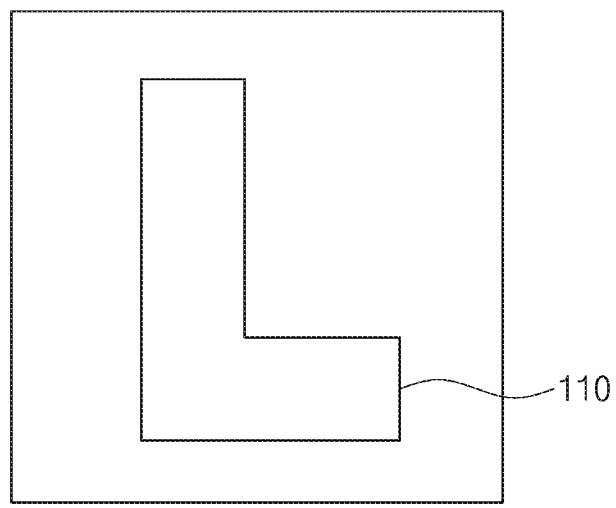
FIGS. 5 to 11 are conceptual diagrams for explaining the inspection method of FIG. 4.

Referring to FIGS. 4 and 5, a design image 110 may be selected (S100). The design image 110 may include properly formatted data (e.g., GDS II) that define a planar shape of a pattern formed on the wafer 100. The design image 110 may be a design image of a weak pattern, among patterns formed on the wafer 100, having a high probability of occurrence of defects, for example photolithography or etch margin issues. For example, as shown in FIG. 5, the design image 110 may be a design image of a pattern with a bent corner. As is obvious to one of ordinary skill in the art, the bent corner may be prone to line width foreshortening or other reductions in image quality.

Figure 6:
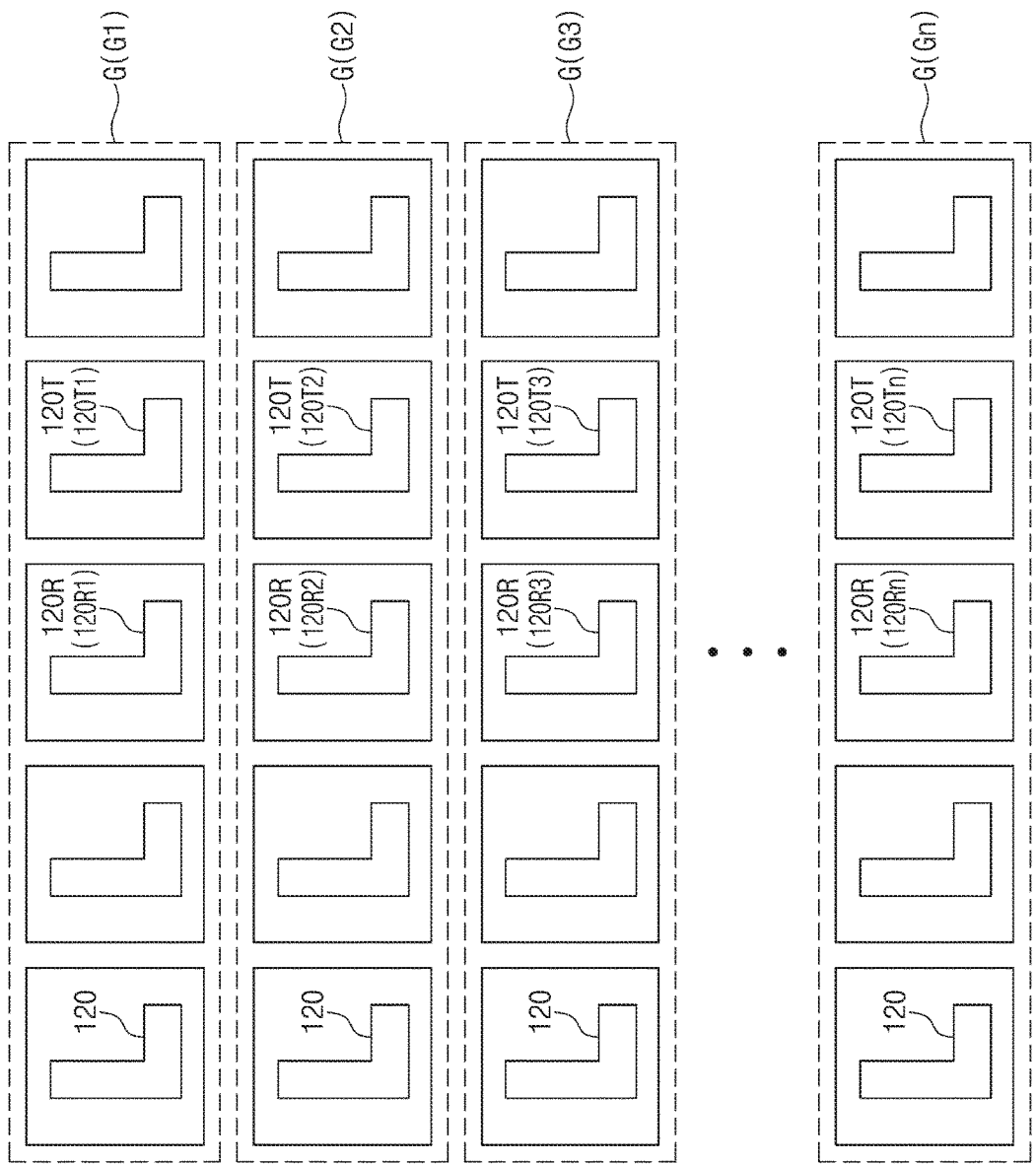

Referring to FIGS. 4 and 6, a pattern group G may be provided on the wafer 100 of FIG. 1 (S200). The pattern group G may include a plurality of patterns 120 formed using the design image 110. The pattern group G may be provided in plural, and the plurality of pattern groups G may include first to n-th pattern groups G1, G2, G3, . . . , Gn. Each of, or at least one of the first to n-th pattern groups G1 to Gn may include the plurality of patterns 120 formed using the design image 110. The first to n-th pattern groups G1 to Gn may respectively be formed using the design image 110 under first to n-th process conditions different from each other.

In some embodiments, the first to n-th pattern groups G1 to Gn may be provided on a single wafer 100. When the wafer 100 experiences a predetermined, or alternatively desired, process, the first to n-th pattern groups G1 to Gn may respectively be formed using the first to n-th process conditions. The first to n-th process conditions may have different conditions about a specific parameter of the predetermined, or alternatively desired, process. For example, when the predetermined, or alternatively desired, process is a photolithography process, the first to n-th process conditions may have different conditions about exposure energy. In this case, the plurality of patterns 120 in the first pattern group G1 may be formed using the design image 110 under the photolithography process at a first exposure energy condition. Likewise, the plurality of patterns 120 in the n-th pattern group Gn may be formed using the design image 110 under the photolithography process at an n-th exposure energy condition (where, n is an integer greater than or equal to 2).

In other embodiments, the wafer 100 may be provided in plural and the first to n-th pattern groups G1 to Gn may be provided respectively on the plurality of wafers 100. For example, one of the pattern groups G1 to Gn may be provided on one of the plurality of wafers 100, and another of the pattern groups G1 to Gn may be provided on another of the plurality of wafers 100. When the predetermined, or desired, process is performed on every each of, or at least one of the plurality of wafers 100, the first to n-th pattern groups G1 to Gn may respectively be formed using the first to n-th process conditions. For example, when the predetermined, or desired, process is an etching process, the first to n-th pattern groups G1 to Gn may have different conditions about an etching time. In this case, the plurality of patterns 120 in the first pattern group G1 may be formed using the design image 110 under the etching process at a first etching time. Likewise, the plurality of patterns 120 in the n-th pattern group Gn may be formed using the design image 110 under the etching process at an n-th etching time (where, n is an integer greater than or equal to 2).

Figure 7:
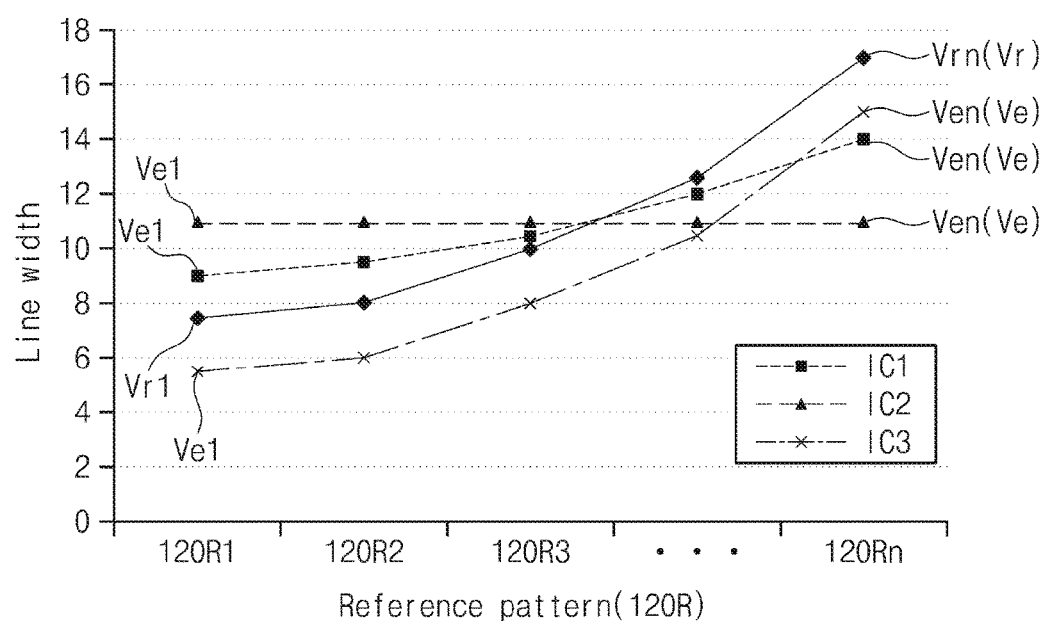

Referring to FIGS. 4, 6, and 7, a reference value Vr of a reference pattern 120R in the pattern group G may be acquired (S300). The reference pattern 120R may be one selected among the plurality of patterns 120 in the pattern group G. The acquisition of the reference value Vr may include loading the wafer 100, on which the pattern group G is formed, on the stage 200 of the inspection system 1000 of FIG. 1 and using the profilometer 300 of FIG. 1 to measure a surface profile of the reference pattern 120R in the pattern group G. For example, the profilometer 300 may measure the surface profile of the reference pattern 120R by physically contacting a surface of the reference pattern 120R. In this case, the reference value Vr may be a line width, or a critical dimension, of the reference pattern 120R that is physically measured using the profilometer 300. The data processor 510 of FIG. 1 may obtain the reference value Vr from the surface profile of the reference pattern 120R.

When the pattern group G is provided in plural, first to n-th reference patterns 120R1, 120R2, 120R3, . . . , 120Rn may respectively be selected from the first to n-th pattern groups G1 to Gn. First to n-th reference values Vr1 to Vrn may respectively be acquired about the first to n-th reference patterns 120R1 to 120Rn. The acquisition of the first to n-th reference values Vr1 to Vrn may include using the profilometer 300 to measure a surface profile of each of, or at least one of the first to n-th reference patterns 120R1 to 120Rn. The first to n-th reference values Vr1 to Vrn may be line widths, or critical dimensions, of the first to n-th reference patterns 120R1 to 120Rn, respectively, that are physically measured using the profilometer 300.

Figure 8:
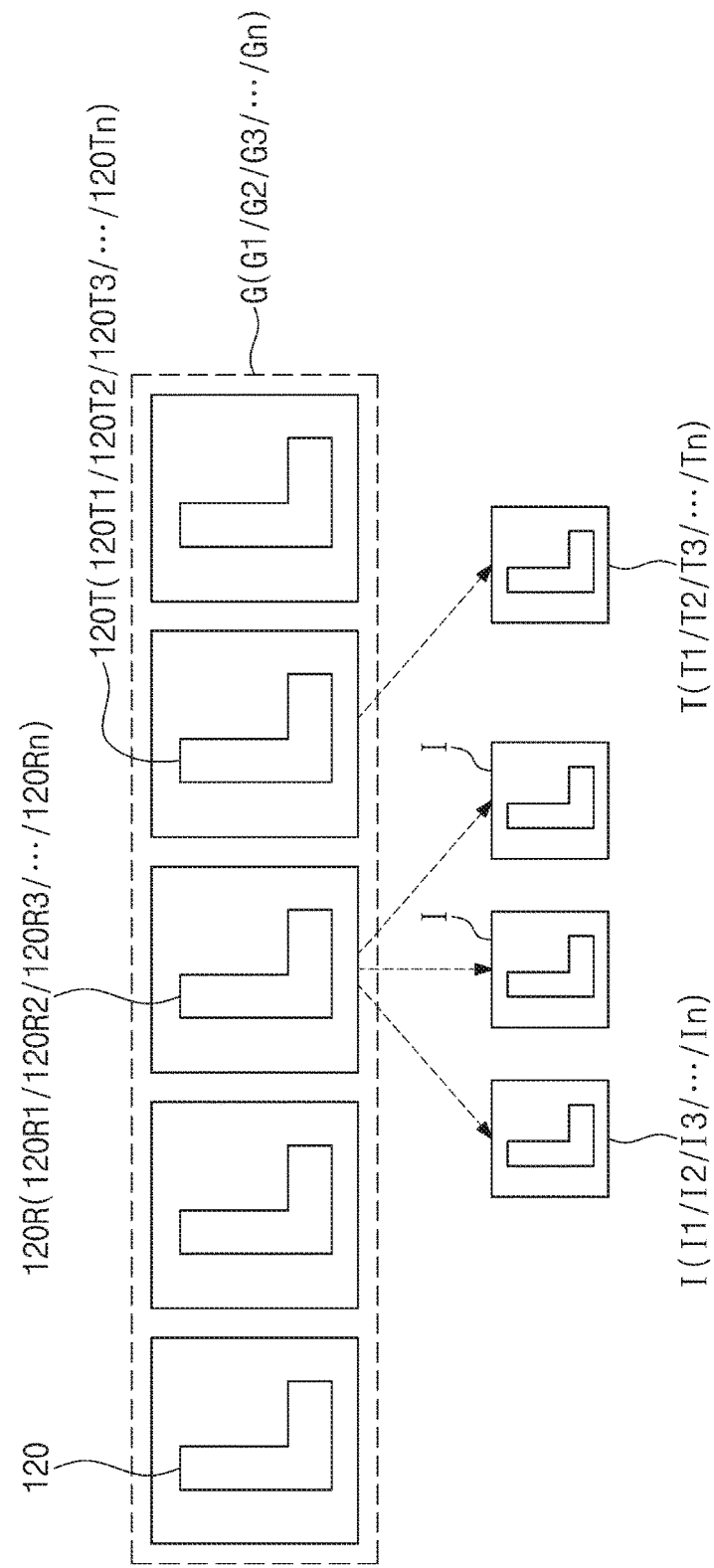

Referring to FIGS. 4, 6, and 8, a plurality of optical inspection conditions may be used to scan reference images I of the reference pattern 120R (S400). In detail, referring back to FIGS. 1 to 3, the profilometer 300 may be used to measure the reference value Vr of the reference pattern 120R, and then the controller 530 may control a horizontal position of the stage 200. The controller 530 may control the horizontal position of the stage 200 so as to allow the optical inspection unit 400 to scan the reference images I of the reference pattern 120R. The controller 530 may independently control the first filter unit 410, the lens unit 420, the iris diaphragm unit 430, the polarizer unit 440, and the second filter unit 450 in the optical inspection unit 400. Changing the optical inspection conditions of the optical inspection unit 400 may thus be possible. The optical inspection unit 400 may scan the reference images I of the reference pattern 120R by using a plurality of optical inspection conditions different from each other, respectively.

When the pattern group G is provided in plural, the reference images I may be scanned for each of, or at least one of the first to n-th reference patterns 120R1 to 120Rn. In detail, the optical inspection unit 400 may scan first reference images I1 of the first reference pattern 120R1 by using the plurality of optical inspection conditions, respectively. Likewise, the optical inspection unit 400 may scan n-th reference images In of the n-th reference pattern 120Rn by using the plurality of optical inspection conditions, respectively (where, n is an integer greater than or equal to 2).

Referring back to FIGS. 4, 6, and 7, estimation values Ve of the reference pattern 120R that are measured from corresponding reference images I of the reference pattern 120R may be obtained (S500). The estimation values Ve may be line widths of the reference pattern 120R that are independently measured from the reference images I. That is, the estimation values Ve may be line widths of the reference pattern 120R that are individually obtained using the plurality of optical inspection conditions (e.g., IC1, IC2, IC3). The data processor 510 of FIG. 1 may obtain the estimation values Ve from corresponding reference images I.

When the pattern group G is provided in plural, the estimation values Ve may be obtained for each of, or at least one of the first to n-th reference patterns 120R1 to 120Rn. In detail, first estimation values Ve1 may be individually measured from the first reference images I1 of the first reference pattern 120R1. That is, the first estimation values Ve1 may be line widths of the first reference pattern 120R1 that are individually obtained using the plurality of optical inspection conditions (e.g., IC1, IC2, IC3). Likewise, n-th estimation values Ven may be individually measured from the n-th reference images In of the n-th reference pattern 120Rn. That is, the n-th estimation values Ven may be line widths of the n-th reference pattern 120Rn (where, n is an integer greater than or equal to 2) that are individually obtained using the plurality of optical inspection conditions (e.g., IC1, IC2, IC3).

Referring to FIGS. 4 and 7, the reference value Vr and the estimation values Ve may be compared with each other such that an optimum, or desired, optical inspection condition may be selected from the plurality of optical inspection conditions (S600). The data processor 510 of FIG. 1 may compare the reference value Vr and the estimation values Ve with each other to select the optimum, or desired, optical inspection condition among the plurality of optical inspection conditions.

When the pattern group G is provided in plural, the first to n-th reference values Vr1 to Vrn may respectively be obtained for the first to n-th reference patterns 120R1 to 120Rn. In addition, one optical inspection condition (e.g., IC1, IC2, or IC3) may be used to respectively obtain the first to n-th estimation values Ve1 to Ven for the first to n-th reference patterns 120R1 to 120Rn. The selection of the optimum, or desired, optical inspection condition may include select one, among the plurality of optical inspection conditions, in which the first to n-th estimation values Ve1 to Ven have correlation with the first to n-th reference values Vr1 to Vrn. For example, a first optical inspection condition IC1 may be used to respectively obtain the first to n-th estimation values Ve1 to Ven for the first to n-th reference patterns 120R1 to 120Rn. A second optical inspection condition IC2 may be used to respectively obtain additional first to n-th estimation values Ve1 to Ven for the first to n-th reference patterns 120R1 to 120Rn. A third optical inspection condition IC3 may be used to respectively obtain additional first to n-th estimation values Ve1 to Ven for the first to n-th reference patterns 120R1 to 120Rn. As shown in FIG. 7, the first to n-th estimation values Ve1 to Ven obtained using the third optical inspection condition IC3 may have correlation with the first to n-th reference values Vr1 to Vrn. In this case, the third optical inspection condition IC3 may be selected as the optimum, or desired, optical inspection condition.

Referring back to FIGS. 4, 6, and 8, the optimum, or desired, optical inspection condition may be used to scan a target image T of a target pattern 120T in the pattern group G (S700). The target pattern 120T may be at least one selected among the plurality of patterns 120 in the pattern group G. Referring back to FIGS. 1 to 3, the data processor 510 may select the optimum, or desired, optical inspection condition from the plurality of optical inspection conditions, and then the controller 530 may control the first filter unit 410, the lens unit 420, the iris diaphragm unit 430, the polarizer unit 440, and the second filter unit 450 in the optical inspection unit 400 so as to allow the optical inspection unit 400 to have the optimum, or desired, optical inspection condition. The controller 530 may control the horizontal position of the stage 200 so as to allow the optical inspection unit 400 to scan the target image T of the target pattern 120T.

When the pattern group G is provided in plural, first to n-th target patterns 120T1, 120T2, 120T3, ..., 120Tn may respectively be selected from the first to n-th pattern groups G1 to Gn. The optical inspection unit 400 may scan first to n-th target images T1, T2, T3, ..., Tn for the first to n-th target patterns 120T1 to 120Tn, respectively.

Figure 9:
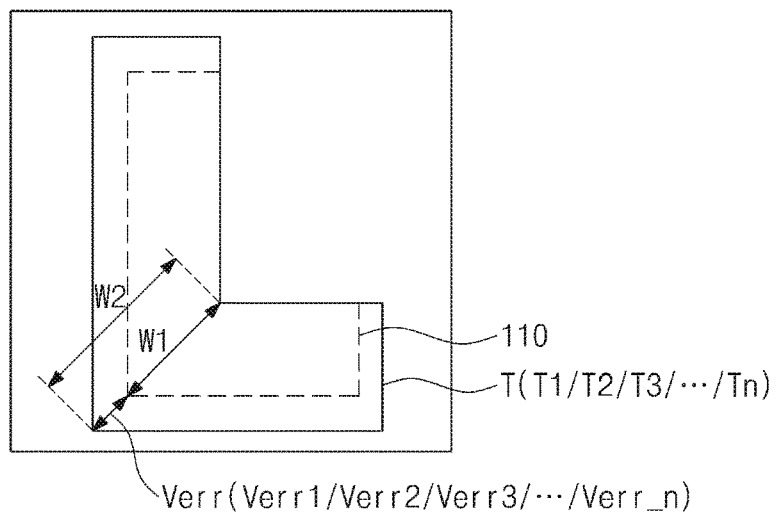

Referring to FIGS. 4 and 9, the design image 110 and the target image T may be compared with each other to perform a quantitative inspection of the target pattern 120T (S800). Referring to FIGS. 1 and 9, the data processor 510 may obtain the target image T from the optical inspection unit 400 and also obtain the design image 110 from the library 520. The data processor 510 may quantitatively compare the target image T with the design image 110 to acquire an error value Verr between the target image T and the design image 110. For example, the acquisition of the error value Verr may include numerically compare a required line width W1 of the target pattern 120T, which is determined by the design image 110, with a measured line width W2 of the target pattern 120T, which is measured from the target image T. In this case, the error value Verr may be a difference between the required line width W1 and the measure line width W2 (e.g., Verr=W1−W2).

When the pattern group G is provided in plural, first to n-th error values Verr1 to Verr_n may respectively be acquired for the first to n-th target patterns 120T1 to 120Tn. The acquisition of the first to n-th error values Verr1 to Verr_n may include quantitatively compare the design image 110 with each of, or at least one of the first to n-th target images T1 to Tn. For example, each of, or at least one of the first to n-th error values Verr1 to Verr_n may be a difference between the required line width W1 determined by design image 110 and the measured line width W2 measured from each of, or at least one of the first to n-th target images T1 to Tn.

Referring back to FIGS. 4 and 6, a process margin may be acquired for the design image 110 by using the first to n-th error values Verr1 to Verr_n respectively obtained from the first to n-th target patterns 120T1 to 120Tn (S900). In detail, the first to n-th pattern groups G1 to Gn may be formed using the first to n-th process conditions, respectively. The first to n-th process conditions may have different conditions from each other about the specific parameter (e.g., exposure energy) of the predetermined, or desired, process (e.g., photolithography process). The first to n-th error values Verr1 to Verr_n may be used to obtain a process margin of the specific parameter (e.g., exposure energy) about the design image 110. In this description, the process margin may refer to a tolerance of a process condition of the specific parameter when the predetermined, or alternatively desired, process is performed to form patterns defined by the design image 110. The acquisition of the process margin of the specific parameter about the design image 110 may include selecting error values within the tolerance among the first to n-th error values Verr1 to Verr_n and obtaining a range of process conditions (e.g., exposure energy conditions) corresponding to the selected error values. In step S1000, the semiconductor package may be fabricated according to the process margin.

Figure 10:
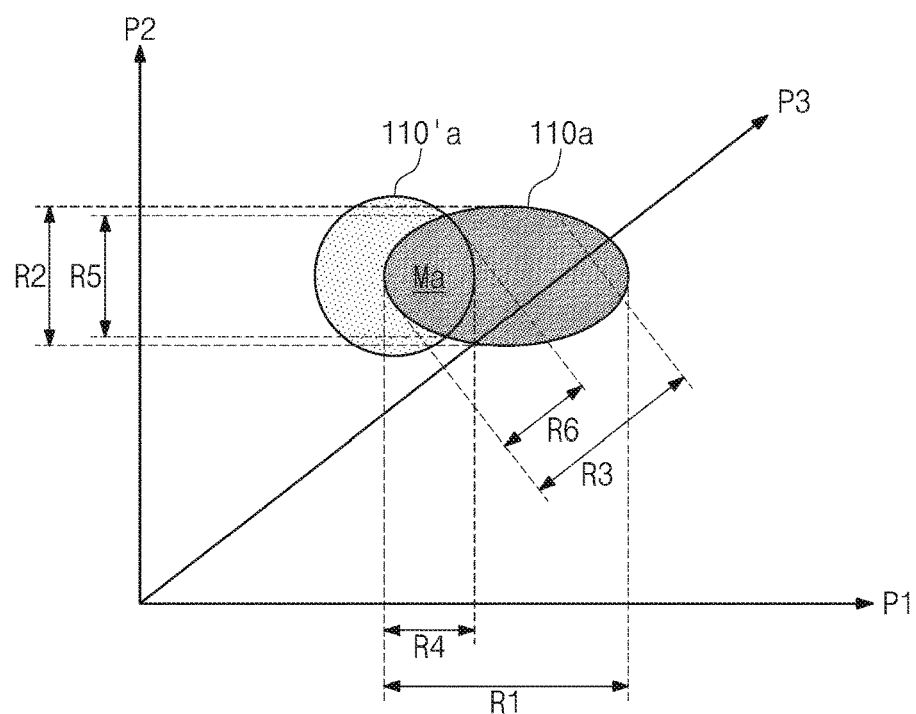

Referring to FIGS. 4 and 10, the steps S200 to S900 of FIG. 4 may be performed with regard to a plurality of parameters P1, P2, and P3. Accordingly, a process margin 110a of the plurality of parameters P1, P2, and P3 may be obtained about the design image 110. For example, after the design image 110 is selected (S100 of FIG. 4), the first to n-th pattern groups G1 to Gn may be provided. The first to n-th pattern groups G1 to Gn may respectively be formed using the first to n-th process conditions having different conditions from each other about a first parameter P1 (e.g., exposure energy). In this case, the first to n-th error values Verr1 to Verr_n obtained at the step S800 of FIG. 4 may be used to acquire a process margin R1 of the first parameter P1 about the design image 110. Thereafter, the first to n-th pattern groups G1 to Gn may additionally be provided. The first to n-th pattern groups G1 to Gn may respectively be formed using the first to n-th process conditions having different conditions from each other about a second parameter P2 (e.g., focus). In this case, the first to n-th error values Verr1 to Verr_n obtained at the step S800 of FIG. 4 may be used to acquire a process margin R2 of the second parameter P2 about the design image 110. Likewise, the first to n-th pattern groups G1 to Gn may further be provided. The first to n-th pattern groups G1 to Gn may respectively be formed using the first to n-th process conditions having different conditions from each other about a third parameter P3 (e.g., etching time). In this case, the first to n-th error values Verr1 to Verr_n obtained at the step S800 of FIG. 4 may be used to acquire a process margin R3 of the third parameter P3 about the design image 110.

Figure 11:
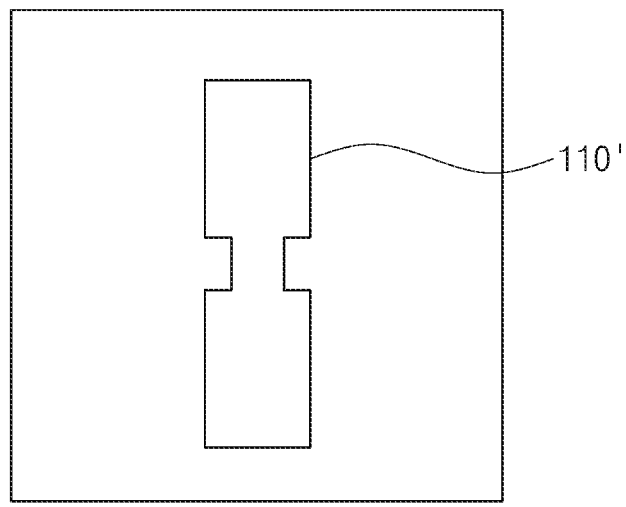

Referring to FIGS. 4, 10, and 11, additional design image 110' may be selected (S100). The additional design image 110' may include properly formatted data (e.g., GDS II) that define a planar shape of a pattern formed on the wafer 100. The additional design image 110' may be a design image of a weak pattern, among patterns formed on the wafer 100, having a high probability of occurrence of defects. For example, as shown in FIG. 11, the additional design image 110' may be a design image of a pattern with a bottleneck. The additional design image 110' may undergo the steps S200 to S900 of FIG. 4, so that a process margin may be obtained for the specific parameter about the additional design image 110'. After the additional design image 110' is selected (S100 of FIG. 4), as discussed with reference to FIGS. 4 and 10, the steps S200 to S900 of FIG. 4 may be performed on each of, or at least one of the plurality of parameters P1, P2, and P3. Accordingly, a process margin 110'a of the plurality of parameters P1, P2, and P3 may be obtained about the additional design image 110'.

The plurality of parameters P1, P2, P3 may have a common process margin Ma that is an overlapping range of the process margins 110a and 110'a of the design images 110 and 110'. The first parameter P1 may have a common process margin R4 that is an overlapping range of the process margins 110a and 110'a of the design images 110 and 110'. The second parameter P2 may have a common process margin R5 that is an overlapping range of the process margins 110a and 110'a of the design images 110 and 110'. Likewise, the third parameter P3 may have a common process margin R6 that is an overlapping range of the process margins 110a and 110'a of the design images 110 and 110'. FIG. 10 shows a method of obtaining the common process margin Ma about three parameters P1, P2, and P3 and two design images 110 and 110', but the inventive concepts are not limited thereto. According to example embodiments of the inventive concepts analyzing a common process margin about an n number of parameters and an m number of design images (where, n and m are an integer) may be possible.

Based on the common process margin Ma of the plurality of parameters P1, P2, and P3 about the design images 110 and 110', a semiconductor device may be fabricated to include patterns defined by the design images 110 and 110'. In this case, in order to form the patterns, process margins of the plurality of parameters P1, P2, and P3 may be determined within the common process margin Ma. Minimizing, or reducing, defects occurred during the formation of the pattern may be possible.

Figure 12:
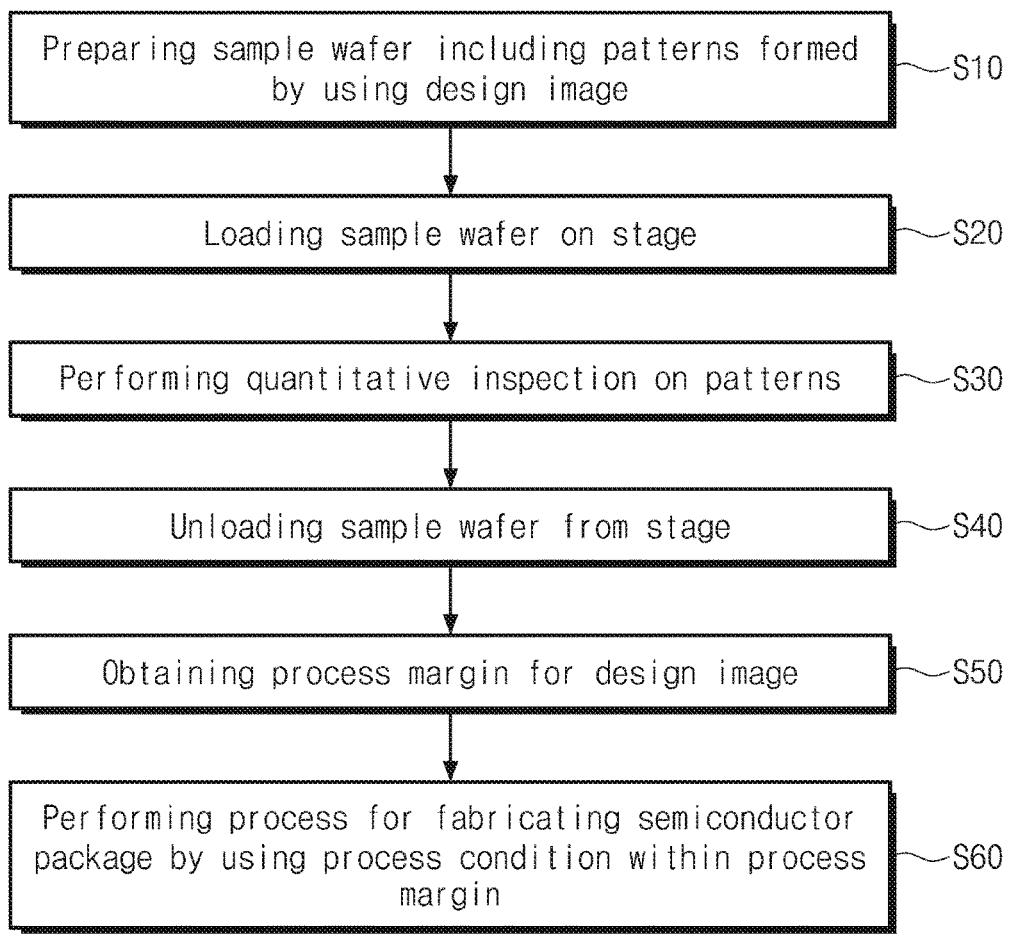
FIG. 12 is a flow chart for explaining a method of fabricating a semiconductor package using an inspection method according to example embodiments of the inventive concepts.
Figure 13:
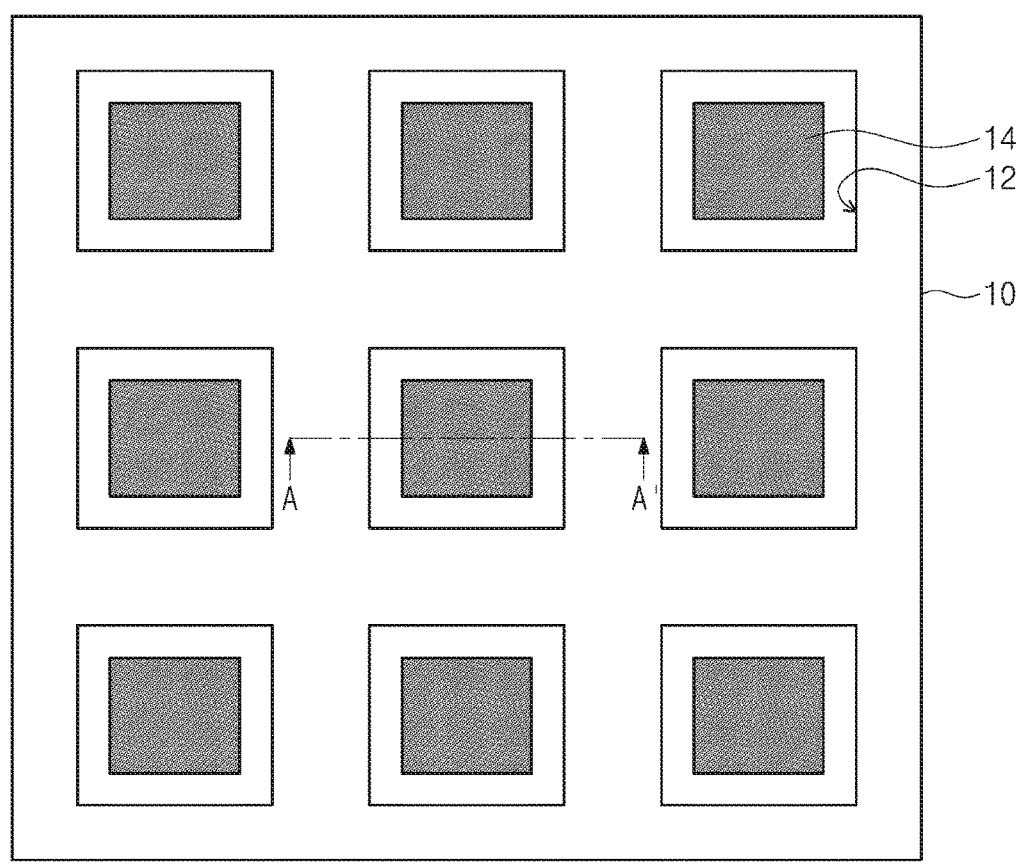
FIG. 13 is a plan view of a semiconductor package fabricated using an inspection method according to example embodiments of the inventive concepts.
Figure 14:
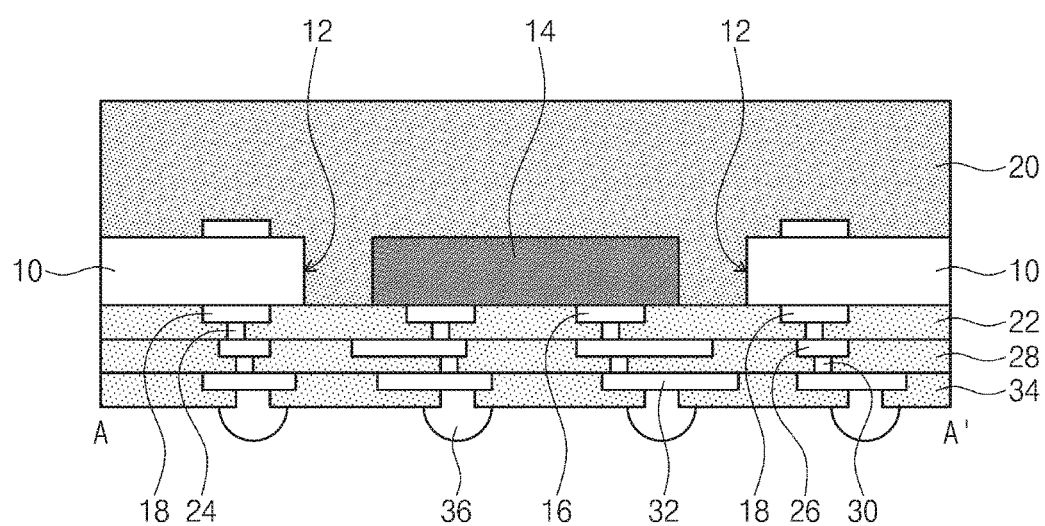
FIG. 14 is a cross-sectional view corresponding to line A-A' of FIG. 13.

FIG. 12 is a flow chart for explaining a method of fabricating a semiconductor package using an inspection method according to example embodiments of the inventive concepts. FIG. 13 is a plan view of a semiconductor package fabricated using an inspection method according to example embodiments of the inventive concepts and FIG. 14 is a cross-sectional view corresponding to line A-A' of FIG. 13.

Referring to FIGS. 1 and 12, a sample wafer 100 may be provided (S10). The sample wafer 100 may include the plurality of patterns 120 formed using the design image 110. In detail, the sample wafer 100 may be provided thereon with the first to n-th pattern groups G1 to Gn discussed with reference to FIG. 6. The first to n-th pattern groups G1 to Gn may be provided on a single sample wafer 100, or respectively on a plurality of sample wafers 100. Each of the first to n-th pattern groups G1 to Gn may include the plurality of patterns 120 formed using the design image 110. The first to n-th pattern groups G1 to Gn may be formed using the first to n-th process conditions having different conditions from each other about the specific parameter.

The sample wafer 100 of FIG. 1 may be loaded on the stage 200 (S20). The inspection system 1000 may be used to perform the steps S300 to S800 of FIG. 4, and thus a quantitative inspection may be carried out on the plurality of patterns 120 formed on the sample wafer 100 (S30). After that, the sample wafer 100 may be unloaded from the stage 200 (S40).

The data processor 510 of FIG. 1 may drive to perform the step S900 of FIG. 4 to obtain a process margin of the specific parameter about the design image 110 (S50). As discussed with reference to FIG. 10, the steps S200 to S900 of FIG. 4 may be performed on each of, or at least one of, the plurality of parameters P1, P2, and P3. Accordingly, a process margin 110a of the plurality of parameters P1, P2, and P3 may be obtained about the design image 110. When additional design image 110' is selected, the steps S200 to S900 of FIG. 4 may be performed on the additional design image 110'. A process margin may thus be obtained for the specific parameter about the additional design image 110'. As discussed with reference to FIG. 10, after the additional design image 110' is selected, the steps S200 to S900 of FIG. 4 may be performed on each of, or at least one of, the plurality of parameters P1, P2, and P3. Accordingly, a process margin 110'a of the plurality of parameters P1, P2, and P3 may be obtained about the additional design image 110'. Each of, or at least one of, the plurality of parameters P1, P2, P3 may have a common process margin Ma that is an overlapping range of the process margins 110a and 110'a of the design images 110 and 110'.

Referring to FIGS. 12 to 14, a process may be performed to fabricate a semiconductor package using a process condition within the obtained process margin (S60).

In detail, a substrate 600 may be first provided. The substrate 600 may be a package substrate on which semiconductor chips are mounted. The substrate 600 may include a support substrate 10 having therethrough a plurality of cavities 12, semiconductor chips 14 each provided in one of the cavities 12, a mold layer 20 provided on one surface of the support substrate 10 and covering the semiconductor chips 14. The mold layer 20 may extend into each of, or at least one of, the cavities 12 and be interposed between the support substrate 10 and each of, or at least one of, the semiconductor chips 14. The substrate 600 may include substrate pads 18 for electrically connecting the support substrate 10 with its corresponding routing lines and device pads 16 for electrically connecting each of, or at least one of, the semiconductor chips 14 with its corresponding routing lines. The routing lines will be described below. The substrate 600 may further include additional substrate pads 18 interposed between the support substrate 10 and the mold layer 20.

A first interlayer dielectric layer 22 may be formed on the substrate 600. The first interlayer dielectric layer 22 may be formed on an opposite surface of the support substrate 10 to cover the substrate pads 18 and the device pads 16. The first interlayer dielectric layer 22 may be in partial contact with the mold layer 20 extending into the cavity 12. The first interlayer dielectric layer 22 may be provided therein with vias 24 that penetrate at least a portion of the first interlayer dielectric layer 22 and thus are connected to the substrate pads 18 and the device pads 16.

Routing lines 26 may be formed on the first interlayer dielectric layer 22. The design image 110 may be a design image of a weak pattern, among the routing lines 26, having a high probability of occurrence of defects. The specific parameter may be a parameter of a predetermined, or alternatively desired, process for forming the routing lines 26, and at the step S50 of FIG. 12, a process margin may be obtained for the specific parameter about the design image 110. For example, the specific parameter may be exposure energy of a photolithography process for forming the routing lines 26, and a specific range of exposure energy conditions may be a process margin about the design image 110. In this case, the photolithography process for forming the routing lines 26 may be performed at an exposure energy condition selected within the specific range. As shown in FIG. 10, when the process margin 110a is obtained for the plurality of parameters P1, P2, and P3 about the design image 110, processes for forming the routing lines 26 may be performed at process conditions selected within the process margins R1, R2, and R3 of the plurality of parameters P1, P2, and P3. Minimizing, or reducing, defects occurred during the formation of the routing lines 26 may be possible.

When additional design image 110' is selected, the additional design image 110' may be a design image of a weak pattern, among the routing patterns 26, having a high probability of occurrence of defects. At the step S50 of FIG. 12, a process margin may be obtained for the specific parameter about the additional design image 110'. As shown in FIG. 10, when the process margin 110'a is obtained for the plurality of parameters P1, P2, and P3 about the additional design image 110', the plurality of parameters P1, P2, and P3 may have a common process margin Ma that is an overlapping range of the process margins 110a and 110'a of the design images 110 and 110'. In this case, processes for forming the routing lines 26 may be performed at process conditions selected within common process margins R4, R5, and R6 of the plurality of parameters P1, P2, and P3. Minimizing, or reducing, defects occurred during the formation of the routing lines 26 may be possible.

A second interlayer dielectric layer 28 may be formed on the routing lines 26, and additional routing lines 32 may be formed on the second interlayer dielectric layer 28. The additional routing lines 32 may be electrically connected to the routing lines 26 through additional vias 30. The additional vias 30 may penetrate at least a portion of the second interlayer dielectric layer 28 and thus be connect to the routing lines 26. The additional routing lines 32 may be formed using an inspection method substantially the same as that used to form the routing lines 26.

A third interlayer dielectric layer 34 may be formed on the additional routing lines 32. The third interlayer dielectric layer 34 may have an opening that exposes at least portions of the additional routing lines 32. A bump 36 may be provided in the opening. The bump 36 may be provided for an electrical connection between the additional routing lines 32 and an external terminal. As a result, a fan-out package may be fabricated to include the semiconductor chips 14 mounted therein.

According to the inventive concepts a reference value of a reference pattern may be obtained by measuring a surface profile of the reference pattern formed using a selected design image. In addition, a plurality of optical inspection conditions may be used to measure reference images of the reference pattern, and estimation values of the reference pattern may be obtained from each of, or at least one of, the reference images. The reference value may be compared with the estimation values to select an optical inspection condition optimized for the design image, from the plurality of optical inspection conditions. The optimized optical inspection condition may be used to scan a target image of a target pattern formed using the design image. Accordingly, high accuracy may be achieved when a quantitative inspection is performed on the target pattern by comparing the design image with the target image. A comparison may involve a root-mean-square analysis of the difference between the design image and the target image. When an additional design image is selected, a reference pattern of the additional design image may be used to select an optical inspection condition optimized for the additional design image. The optimized optical inspection condition may be used to scan a target image of a target pattern formed using the additional design image, such that a quantitative inspection of the target pattern formed using the additional design image may have high accuracy. Hence, there may be provided a quantitative inspection method and an inspection system having high accuracy.

In addition, a result of the quantitative inspection on the target pattern may be used to obtain a process margin of each of, or at least one of, a plurality of parameters about the design image. When an additional design image is selected, a process margin may be obtained for each of, or at least one of, the plurality of parameters about the additional design image. Accordingly, a multidimensional analysis of the process margin may possibly be performed for a plurality of process parameters and a plurality of design images. When forming routing lines of a semiconductor package based on a result of the multidimensional analysis of the process margin, occurrence of defects may be minimized during the formation of the routing lines. As a result, there may be provided a method of fabricating a semiconductor package capable of minimizing occurrence of defects.

Figure 15:
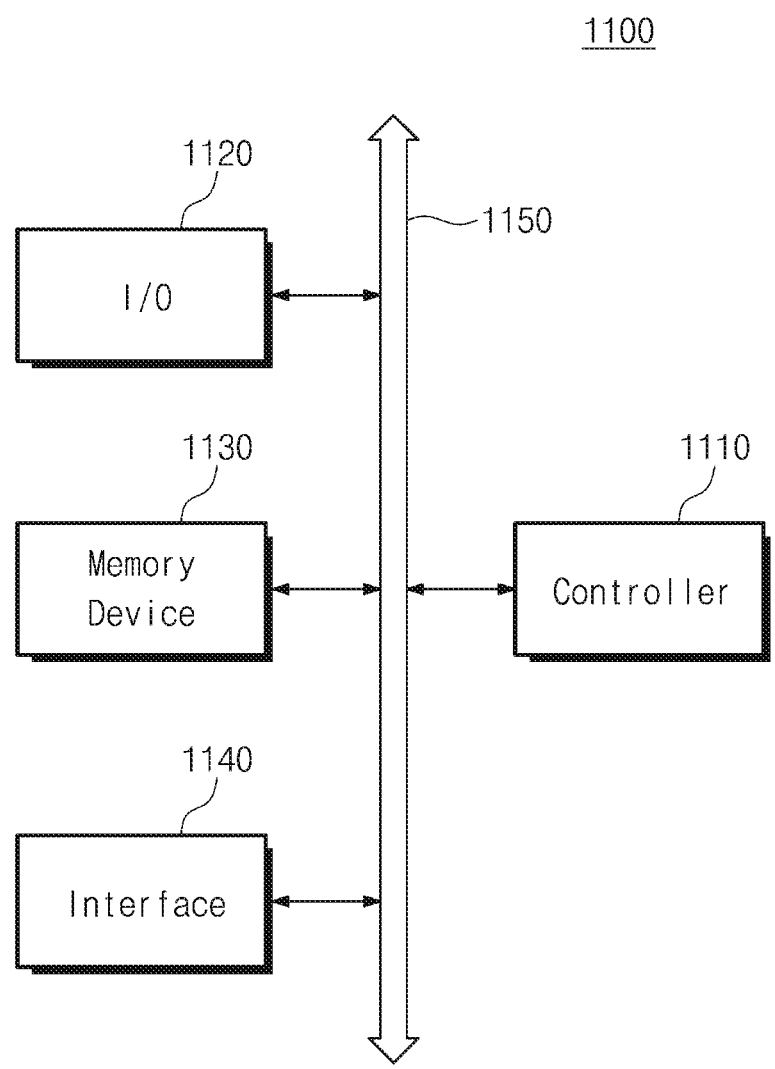
FIG. 15 is a block diagram illustrating an example of electronic systems including semiconductor packages fabricated according to example embodiments of the inventive concepts.

FIG. 15 is a block diagram illustrating an example of electronic systems including semiconductor packages manufactured according to embodiments of the inventive concepts.

Referring to FIG. 15, an electronic system 1100 manufactured according to an embodiment of the inventive concepts may include a controller 1110, an input/output (I/O)

device 1120, a memory device 1130, an interface 1140, and a bus 1150. The controller 1100, the I/O device 1120, the memory device 1130, and/or the interface 1140 may be connected to each other via the bus 1150. The bus 1150 corresponds to a path along which data are transmitted.

The controller 1110 may include at least one of a microprocessor, a digital signal processor, a microcontroller, and logic elements capable of performing similar functions to those of a microprocessor, a digital signal processor and a microcontroller. The I/O device 1120 may include a keypad, a keyboard, and a display device. The memory device 1130 may store data and/or commands. The interface 1140 may be used to transmit/receive data to/from a communication network. The interface 1140 may be a wired or wireless interface. In an exemplary embodiment, the interface 1140 may include an antenna or a wired/wireless transceiver. Although not shown, the electronic system 1100 may include an operating memory for improving the operation of the controller 1110 and may further include a high-speed dynamic random access memory (DRAM) and/or SRAM.

The electronic system 1100 may be applied to all types of electronic products capable of transmitting and/or receiving information in a wireless environment, such as a personal digital assistant (PDA), a portable computer, a web tablet, a wireless phone, a mobile phone, a digital music player, and a memory card.

The aforementioned description provides example embodiments for explaining the inventive concepts. Therefore, the inventive concepts are not limited to the embodiments described above, and it will be understood by one of ordinary skill in the art that variations in form and detail may be made therein without departing from the spirit and essential features of the inventive concepts.

What is claimed is:

1. A method comprising:
   obtaining a reference value by measuring a surface profile of a reference pattern;
   scanning reference images of the reference pattern by using a plurality of optical inspection conditions;
   obtaining estimation values of the reference pattern measured from the reference images;
   selecting a desired optical inspection condition among the plurality of optical inspection conditions by comparing the reference value with the estimation values;
   scanning a target image of a target pattern by using the desired optical inspection condition; and
   obtaining an error value by quantitatively comparing the target image with a design image of the target pattern.

2. The method of claim 1, wherein
   the design image defines a planar shape of a pattern on a wafer, and
   the reference pattern and the target pattern are patterns that are on the wafer in a corresponding to the design image.

3. The method of claim 1, wherein obtaining the reference value includes measuring the surface profile of the reference pattern by using a contact or pseudo-contact profilometer.

4. The method of claim 3, wherein
   the reference value is a line width of the reference pattern, which is measured using the profilometer, and
   the estimation values are line widths of the reference pattern, which is measured from the reference images.

5. The method of claim 1, further comprising:
   providing first to n-th pattern groups formed using first to n-th process conditions, respectively,
   wherein at least one of the first to n-th pattern groups comprises a plurality of patterns that are formed on a wafer using the design image, and
   wherein the reference pattern and the target pattern are selected from the plurality of patterns included in the at least one of the first to n-th pattern groups.

6. The method of claim 5, wherein
   the reference pattern includes first to n-th reference patterns respectively selected from the first to n-th pattern groups,
   obtaining the reference value includes acquiring first to n-th reference values respectively from the first to n-th reference patterns,
   obtaining the estimation values includes acquiring first to n-th estimation values respectively from the first to n-th reference patterns using one optical inspection condition, and
   selecting the desired optical inspection condition includes selecting the one optical inspection condition, among the plurality of optical inspection conditions, in which the first to n-th estimation values have correlation with the first to n-th reference values.

7. The method of claim 5, wherein
   the target pattern includes first to n-th target patterns respectively selected from the first to n-th pattern groups,
   scanning the target image includes scanning first to n-th target images of the first to n-th target patterns, respectively, by using the desired optical inspection condition, and
   obtaining the error value includes acquiring first to n-th error values by comparing the design image with at least one of the first to n-th target images.

8. The method of claim 7, further comprising:
   obtaining a range of process conditions within a tolerance among the first to n-th process conditions,
   wherein obtaining the range of process conditions within the tolerance comprises:
      selecting error values within the tolerance among the first to n-th error values; and
      acquiring a range of process conditions corresponding to the selected error values.

9. The method of claim 5, wherein the first to n-th process conditions have different conditions from one another about a specific parameter of a desired process performed on the wafer.

10. The method of claim 1, wherein
    obtaining the error value includes numerically comparing a required line width of the target pattern with a measured line width of the target pattern, the required line width being determined by the design image and the measured line width being measured from the target image,
    wherein the error value is a difference between the required line width and the measured line width.

11. The method of claim 1, further comprising:
    fabricating a semiconductor package using a process condition determined from the error value.

12. A method comprising:
    preparing a sample wafer including a plurality of patterns formed using a pre-selected design image;
    performing a quantitative inspection on the plurality of patterns; and
    forming routing lines on a semiconductor package substrate to fabricate a semiconductor package, the routing lines being formed by using a process condition of a desired process, the process condition being selected using a result of the quantitative inspection, wherein the design image is a design image of a weak routing pattern, among the routing lines, having a high probability of occurrence of defects, wherein performing the quantitative inspection on the plurality of patterns includes:

obtaining a reference value by measuring a surface profile of a reference pattern selected from the plurality of patterns;

scanning reference images of the reference pattern by using a plurality of optical inspection conditions;

obtaining estimation values of the reference pattern that are measured from the reference images;

selecting a desired optical inspection condition among the plurality of optical inspection conditions by comparing the reference value with the estimation values;

scanning a target image of a target pattern selected from the plurality of patterns by using the desired optical inspection condition; and obtaining an error value by numerically comparing the design image with the target image.

13. A method comprising:

preparing a sample wafer including first to n-th pattern groups formed using first to n-th process conditions, respectively;

obtaining a reference value by measuring a surface profile of a reference pattern, the reference pattern being selected from a plurality of patterns in each of the first to n-th pattern groups;

scanning reference images of the reference pattern by using a plurality of optical inspection conditions;

obtaining estimation values of the reference pattern measured from the reference images;

selecting a desired optical inspection condition among the plurality of optical inspection conditions by comparing the reference value with the estimation values;

scanning a target image of a target pattern by using the desired optical inspection condition, the target pattern being selected from the plurality of patterns in each of the first to n-th pattern groups;

obtaining an error value by comparing the target image with a design image of the target pattern; and obtaining a range of process conditions within a tolerance among the first to n-th process conditions using the error value.

14. The method of claim 13, wherein the reference pattern includes first to n-th reference patterns respectively selected from the first to n-th pattern groups, obtaining the reference value includes acquiring first to n-th reference values respectively from the first to n-th reference patterns, scanning the reference images includes acquiring first to n-th reference images respectively from the first to n-th reference patterns by using each of the plurality of optical inspection conditions, obtaining the estimation values includes acquiring first to n-th estimation values respectively from the first to n-th reference images, and selecting the desired optical inspection condition includes selecting one optical inspection condition, among the plurality of optical inspection conditions, in which the first to n-th estimation values have correlation with the first to n-th reference values.

15. The method of claim 14, wherein the target pattern includes first to n-th target patterns respectively selected from the first to n-th pattern groups, scanning the target image includes scanning first to n-th target images of the first to n-th target patterns, respectively, by using the desired optical inspection condition, and obtaining the error value includes acquiring first to n-th error values by comparing the design image with the first to n-th target images.

16. The method of claim 15, wherein obtaining the range of process conditions within the tolerance comprises:

selecting error values within the tolerance among the first to n-th error values; and acquiring a range of process conditions corresponding to the selected error values.

17. The method of claim 13, wherein the plurality of patterns in each of the first to n-th pattern groups are formed using the design image.

18. The method of claim 13, further comprising:

fabricating an electronic system using the range of process conditions within the tolerance.

19. The method of claim 13, wherein the first to n-th process conditions have different conditions from one another about a specific parameter of a desired process performed on the sample wafer.

20. The method of claim 13, wherein obtaining the reference value includes measuring the surface profile of the reference pattern by using a contact or pseudo-contact profilometer.

* * * * *